(12) United States Patent
Chang (10) Patent No.: US 9,843,007 B2
(45) Date of Patent: Dec. 12, 2017

(54) FIELD EFFECT TRANSISTOR STRUCTURE WITH GATE STRUCTURE HAVING A WALL AND FLOOR PORTIONS

(71) Applicant: National Chiao Tung University, Hsinchu (TW)

(72) Inventor: Chun-Yen Chang, Hsinchu County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 15/225,841

(22) Filed: Aug. 2, 2016

(65) Prior Publication Data

US 2017/0317302 A1   Nov. 2, 2017

(30) Foreign Application Priority Data

Apr. 28, 2016   (TW) .............................. 105113196 A (51) Int. Cl.
H01L 21/84 (2006.01)
H01L 51/05 (2006.01)
(Continued)

(52) U.S. Cl.
CPC ...... H01L 51/0554 (2013.01); H01L 27/0886 (2013.01); H01L 27/283 (2013.01);
(Continued)

(58) Field of Classification Search
CPC .............. H01L 51/0554; H01L 27/283; H01L 51/0021; H01L 51/0516; H01L 51/0562; H01L 51/102; H01L 27/0886
See application file for complete search history.

(56) References Cited

U.S. PATENT DOCUMENTS 7,541,267 B1 * 6/2009 Wang ................ H01L 29/42392
257/E21.233
8,026,553 B2 * 9/2011 Shino ....................... H01L 21/84
257/347

(Continued)

FOREIGN PATENT DOCUMENTS

CN            1708858         12/2005
TW            I355691          1/2012

OTHER PUBLICATIONS

Ota et al., "Threshold Voltage Control by Substrate Bias in 10-nm-Diameter Tri-Gate Nanowire MOSFET on Ultrathin Box," IEEE Electron Device Letters, Feb. 2013, pp. 187-189.

(Continued)

Primary Examiner — Alonzo Chambliss
(74) Attorney, Agent, or Firm — JCIPRNET (57) ABSTRACT

A field effect transistor (FET) structure includes a substrate, an internal gate, an insulation layer, a semiconductor strip, a gate dielectric insulator, and a gate conductor. The internal gate includes a floor portion located on the substrate and a wall portion extending from the floor portion. The insulation layer is located on the floor portion of the internal gate. The semiconductor strip is located on the wall portion and a portion of the insulation layer, and the semiconductor strip includes source/drain regions and a channel region adjacent to the source/drain regions. The gate dielectric insulator is located on the channel region. The gate conductor is located on the gate dielectric insulator.

18 Claims, 9 Drawing Sheets

(51) Int. Cl.
*H01L 51/10* (2006.01)
*H01L 27/28* (2006.01)
*H01L 51/00* (2006.01)
*H01L 27/088* (2006.01)

(52) U.S. Cl.
CPC ...... *H01L 51/0021* (2013.01); *H01L 51/0516* (2013.01); *H01L 51/0562* (2013.01); *H01L 51/102* (2013.01); H01L 51/0529 (2013.01); H01L 51/107 (2013.01)

(56) References Cited

U.S. PATENT DOCUMENTS

| | | | |
|---|---|---|---|
| 8,178,862 B2 | 5/2012 | Colinge | |
| 8,729,629 B2 | 5/2014 | Toren et al. | |
| 8,803,233 B2 | 8/2014 | Cheng et al. | |
| 8,923,035 B2 | 12/2014 | Min et al. | |
| 9,136,376 B2 | 9/2015 | Moon et al. | |
| 2004/0217433 A1* | 11/2004 | Yeo | H01L 21/26586 257/412 |
| 2008/0230852 A1* | 9/2008 | Yu | H01L 21/82343 257/401 |

OTHER PUBLICATIONS

Kim et al., "First Demonstration of Junctionless Accumulation-Mode Bulk FinFETs With Robust Junction Isolation" IEEE Electron Device Letters, Dec. 1013, pp. 1479-1481.

Liu et al., "Impact of Back Bias on Ultra-Thin Body and BOX (UTBB) Devices," 2011 Symposium on VLSI Technology Digest of Technical Papers, Jun. 2011, pp. 160-161.

Cheng et al., "Back-gate bias effect on nanosheet hybrid P/N channel of junctionless thin-film transistor with increased Ion versus decreased Ioff" Applied Physics Letters, Nov. 2015, pp. 182105.

\* cited by examiner

FIELD EFFECT TRANSISTOR STRUCTURE WITH GATE STRUCTURE HAVING A WALL AND FLOOR PORTIONS

CROSS-REFERENCE TO RELATED APPLICATION

This application claims the priority benefit of Taiwan application serial no. 105113196, filed on Apr. 28, 2016. The entirety of the above-mentioned patent application is hereby incorporated by reference herein and made a part of this specification.

TECHNICAL FIELD

The disclosure relates to a semiconductor device, and more particularly, to a field effect transistor (FET) structure.

DESCRIPTION OF RELATED ART

In recent years, due to the requirement for the miniaturization of transistors, various manufacturing technologies have developed. Here, the junctionless (JL) field effect transistor (FET) that can effectively lessen the impact of short channel effect (SCE) and parasitic series resistance has been considered as one of the mainstream products.

Nevertheless, it is difficult to manufacture the JL FET, and the overly high source/drain (S/D) series resistance may lead to the decrease in the drain current. Therefore, how to achieve satisfactory electrical performance and simultaneously simplify the manufacturing process has become one of the challenges that the manufacturers face.

SUMMARY

The disclosure provides an FET structure that can prevent the issue of the roll-off of a threshold voltage and is characterized by a negligible drain-induced barrier lowering (DIBL), the sub-threshold slope (SS) approximating to an ideal value, a high on/off current ratio, high threshold voltage modulation, reduced low-frequency noise (LFN), good reliability, low current leakage, small series resistance, and reduced current crowding effects.

In an embodiment of the disclosure, an FET structure that includes a substrate, an internal gate, an insulation layer, a semiconductor strip, a gate dielectric insulator, and a gate conductor is provided. The internal gate includes a floor portion located on the substrate and a wall portion extending from the floor portion. The insulation layer is located on the floor portion of the internal gate. The semiconductor strip is located on the wall portion and a portion of the insulation layer, and the semiconductor strip includes source/drain regions and a channel region adjacent to the source/drain regions. The gate dielectric insulator is located on the channel region. The gate conductor is located on the gate dielectric insulator.

According to an embodiment of the disclosure, the wall portion includes a semiconductor, a conductor, or an insulator.

According to an embodiment of the disclosure, the semiconductor strip includes a first semiconductor layer and a second semiconductor layer located on the first semiconductor layer, and a conductivity type of the first semiconductor layer is different from a conductivity type of the second semiconductor layer.

According to an embodiment of the disclosure, the insulation layer may be replaced by a third semiconductor layer with a conductivity type different with the conductivity type of the first semiconductor layer for forming a pn junction.

According to an embodiment of the disclosure, the first semiconductor layer in the channel region is an inverted-U shaped structure, and the wall portion extends into the inverted-U shaped structure from the floor portion.

According to an embodiment of the disclosure, the semiconductor strip further includes a third semiconductor layer different from the second semiconductor layer, and the third semiconductor layer is located on the second semiconductor layer.

According to an embodiment of the disclosure, the substrate includes a semiconductor or a conductor.

According to an embodiment of the disclosure, the substrate includes metal.

According to an embodiment of the disclosure, the internal gate includes a conductive poly-semiconductor, an amorphous semiconductor, or a single crystal material.

According to an embodiment of the disclosure, the internal gate includes a conductive material.

According to an embodiment of the disclosure, the gate dielectric insulator includes a dielectric layer located on the channel region and a polar ferroelectric layer located on the dielectric layer, and the polar ferroelectric layer achieves a negative capacitance effect.

According to an embodiment of the disclosure, the gate dielectric insulator includes a polar ferroelectric layer and a charge trapping layer, locations of the polar ferroelectric layer and the charge trapping layer are exchangeable, and the FET structure acts as a non-volatile memory.

According to an embodiment of the disclosure, the gate dielectric insulator includes a charge trapping layer and a polar ferroelectric layer successively formed on the charge trapping layer, and the FET structure acts as a non-volatile memory.

According to an embodiment of the disclosure, the charge trapping layer is composed by a layer of metal, semiconductor, or dielectric.

According to an embodiment of the disclosure, the FET structure is a nano-dot memory.

According to an embodiment of the disclosure, the charge trapping layer includes $Zr_xHf_ySr_zSiO_3$, metal, a semiconductor, nano-dot metal, or an insulator, the polar ferroelectric layer comprises $Li_xHf_yZr_zO_3$, $Pb_xBa_ySr_zTiO_3$, $Li_xK_yTa_zNbO_3$, $La_xSr_yBa_zMnO_3$, $Zr_xHf_ySr_zSiO_3$, $Ba_xLa_ySr_zFe_2O_3$, $Ba_xLa_ySr_zNiO_3$, or $Ba_xLa_ySr_zCoO_3$, $0 \leq x \leq 1$, $0 \leq y \leq 1$, $0 \leq z \leq 1$, and $0 \leq r \leq 1$.

According to an embodiment of the disclosure, the substrate is a p-type substrate, for instance, and the internal gate is an n-type conductor, for instance. The semiconductor strip includes a p-type semiconductor layer located above the internal gate and an n-type semiconductor layer located on the p-type semiconductor layer. The p-type substrate and the p-type semiconductor layer include a material selected from the group consisting of (poly(3-alkylthiophene)), (poly(9,9-dioctylfluorene-co-bithiophene)), tetracene, pentacene, hexacene, and anthracene. The n-type semiconductor layer includes a material selected from the group consisting of naphthalene carbodiimide, perylene tetracarboxylic diimide, and fluorocarbon-substituted thiophene.

According to an embodiment of the disclosure, the substrate is an n-type substrate, for instance, and the internal gate is a p-type conductor, for instance. The semiconductor strip includes an n-type semiconductor layer located above the internal gate and a p-type semiconductor layer located on the n-type semiconductor layer. The p-type semiconductor layer includes a material selected from the group consisting of (poly(3-alkylthiophene)), (poly(9,9-dioctylfluorene-co-bithiophene)), tetracene, pentacene, hexacene, and anthracene. The n-type substrate and the n-type semiconductor layer include a material selected from the group consisting of naphthalene carbodiimide, perylene tetracarboxylic diimide, and fluorocarbon-substituted thiophene.

In view of the above, a hybrid P-N channel is used in the JL transistor, which is conducive to the simplification of the manufacturing process and better preventing the issue of the roll-off of the threshold voltage; what is more, the resultant FET structure can be characterized by a negligible BIDL, the SS approximating to an ideal value, a high on/off current ratio, high threshold voltage modulation, reduced LFN, good reliability, low current leakage, small series resistance, and reduced current crowding effects. With the design of a three-dimensional dual-gate structure, in the matter of the electrical performance, the threshold voltage can be better controlled, the issue of SCE can be resolved, and the current driving capability can be enhanced. In addition, the physical and manufacturing limitation on the miniaturization of the gate length (Lg) can be broken.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 3A to FIG. 3E are schematic views illustrating a manufacturing process of an FET structure according to a second embodiment of the disclosure.

FIG. 8A to FIG. 8E are schematic views illustrating a manufacturing process of an FET structure according to a sixth embodiment of the disclosure.

DETAILED DESCRIPTION OF DISCLOSED EMBODIMENTS

A description accompanied with drawings is provided in the following to sufficiently explain embodiments of the disclosure. However, note that the disclosure may still be implemented in many other different forms and should not be construed as limited to the embodiments described hereinafter. In the drawings, in order to apparently indicate the sizes of each layer and region, the layers and regions are magnified and not sized.

Hereinafter, when an element or layer is referred to as being "located on" another element or layer, it can be directly located on the other element or layer. That is, for instance, intervening elements or layers may be present. Moreover, when an element is referred to as "contacting" another element or layer, there are no intervening elements or layers present therebetween. Other words for describing space relations, such as "below", "above" or the like are used to describe the relationship between an element or layer and another element or layer. Such spatially relative tetras are used to describe a relationship between an element or layer and another element or layer illustrated in the drawings. It will be understood that the spatially relative terms are intended to encompass different orientations of the elements in use and/or operation in addition to the orientation depicted in the drawings. For example, if the device in the drawings is turned over, elements described as "on" and/or "above" other elements or layers would then be oriented "below" and/or "beneath" the other elements or layers.

Figure 1:
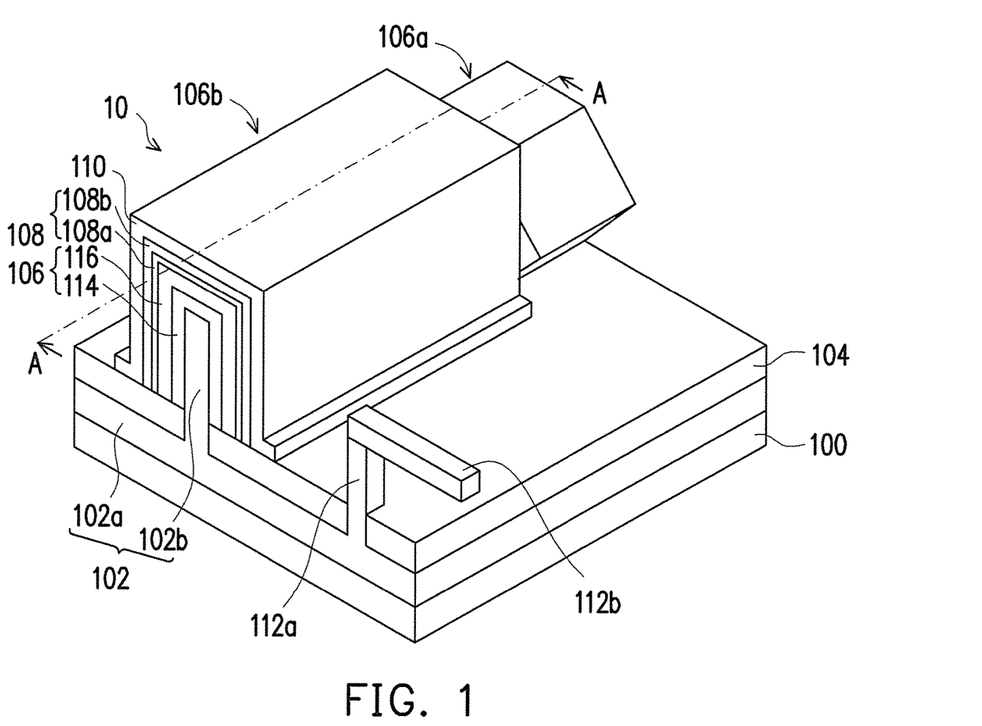
FIG. 1 is a schematic three-dimensional view illustrating an FET structure according to a first embodiment of the disclosure.
Figure 2:
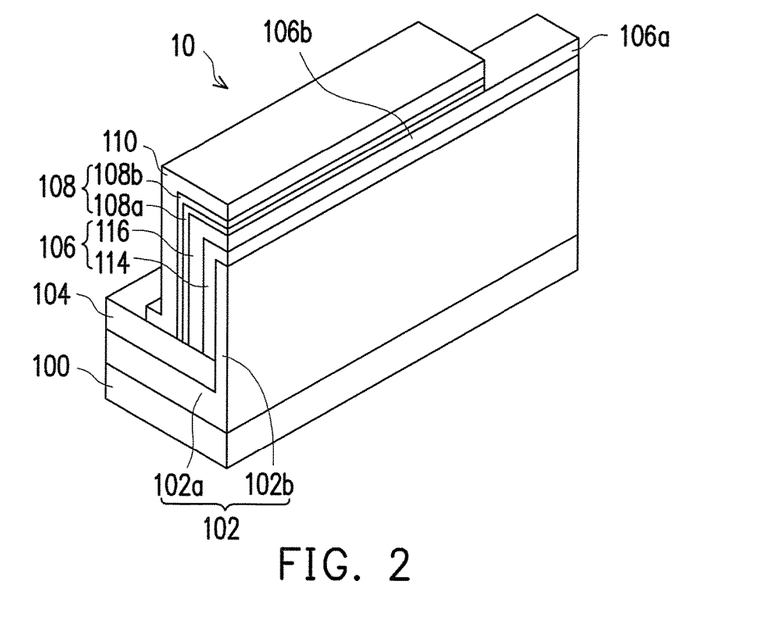
FIG. 2 is a schematic three-dimensional view taken along a section line A-A depicted in FIG. 1.

FIG. 1 is a schematic three-dimensional view illustrating an FET structure according to a first embodiment of the disclosure. FIG. 2 is a schematic three-dimensional view taken along a section line A-A depicted in FIG. 1.

With reference to FIG. 1 and FIG. 2, an FET structure 10 provided in the first embodiment includes a substrate 100, an internal gate 102, an insulation layer 104, a semiconductor strip 106, a gate dielectric insulator 108, and a gate conductor 110. The internal gate 102 includes a floor portion 102a located on the substrate 100 and a wall portion 102b extending from the floor portion 102a. The insulation layer 104 is located on the floor portion 102a of the internal gate 102. The semiconductor strip 106 is located on the wall portion 102b and a portion of the insulation layer 104, and the semiconductor strip 106 includes source/drain regions 106a and a channel region 106b adjacent to the source/drain regions 106a. The gate dielectric insulator 108 is located on the channel region 106b. The gate conductor 110 is located on the gate dielectric insulator 108.

The substrate 100 provided in the first embodiment may be a semiconductor or a conductor, e.g., metal. The internal gate 102 is, for instance, a conductive poly-semiconductor, an amorphous semiconductor, or a single crystal material. Alternatively, the internal gate 102 may be other conductive materials.

The insulation layer 104 provided in the first embodiment covers the floor portion 102a of the internal gate 102, and the semiconductor strip 106 covers the top surface and two sidewalls of the wall portion 102b of the internal gate 102 (an inverted-U shaped structure). In an embodiment of the disclosure, the FET structure 10 may further include a contact pillar 112a connected to the floor portion 102a of the internal gate 102. The contact pillar 112a and the internal gate 102 may belong to the same structure, or the contact pillar 112 may be an external conductor. The external conductor may be a conductive material, e.g., metal or polysilicon. In an embodiment of the disclosure, the FET structure 10 may further include an electrical contact 112b connected to the contact pillar 112a, so as to supply a bias voltage to the wall portion 102b of the internal gate 102 through the contact pillar 112a. Due to carrier confinement, the bias voltage supplied to the internal gate 102 may contribute to the effective modulation of the characteristics of the FET structure 10. The electrical contact 112b is metal or conductive polysilicon, for instance.

The semiconductor strip 106 provided in the first embodiment includes a first semiconductor layer 114 and a second semiconductor layer 116 located on the first semiconductor layer 114, and a conductivity type of the first semiconductor layer 114 is different from a conductivity type of the second semiconductor layer 116. In an embodiment, the first semiconductor layer 114 is a p-type semiconductor layer, and the second-type semiconductor layer 116 is an n-type semiconductor layer. In another embodiment, the first semiconductor layer 114 is an n-type semiconductor layer, and the second semiconductor layer 116 is a p-type semiconductor layer. In some embodiments of the disclosure, the internal gate 102 and the semiconductor strip 106 including the first semiconductor layer 114 and the second semiconductor layer 116 are mono-crystalline silicon formed by performing an epitaxial growing process, for instance; however, the disclosure is not limited thereto. In the first embodiment, the first semiconductor layer 114 in the channel region 106b and the source/drain regions 106a is an inverted-U shaped structure, and the wall portion 102b extends into the inverted-U shaped structure from the floor portion 102a; the second semiconductor layer 116a in the channel region 106b is an inverted-U shaped structure, and the second semiconductor layer 116a in the source/drain regions 106a has a hexagonal cross-section. Moreover, in some embodiments of the disclosure, the insulation layer 104 may be replaced by a third semiconductor layer (not shown) with a conductivity type different with the conductivity type of the first semiconductor layer 114 for forming a pn junction.

According to the first embodiment, the substrate 100 may be a p-type substrate, and the internal gate 102 may be an n-type conductor. The semiconductor strip 106 may include a p-type semiconductor layer located above the internal gate 102 and an n-type semiconductor layer located on the p-type semiconductor layer. Here, the p-type semiconductor layer acts as the first semiconductor layer 114, and the n-type semiconductor layer acts as the second semiconductor layer 116. The p-type substrate and the p-type semiconductor layer include a material selected from the group consisting of (poly(3-alkylthiophene)), (poly(9,9-dioctylfluorene-co-bithiophene)), tetracene, pentacene, hexacene, and anthracene, and the n-type semiconductor layer includes a material selected from the group consisting of naphthalene carbodiimide, perylene tetracarboxylic diimide, and fluorocarbon-substituted thiophene.

In the first embodiment, the substrate 100 may also be an n-type substrate, and the internal gate 102 may be a p-type conductor. The semiconductor strip 106 may include an n-type semiconductor layer located above the internal gate 102 and a p-type semiconductor layer located on the n-type semiconductor layer. Here, the n-type semiconductor layer acts as the first semiconductor layer 114, and the p-type semiconductor layer acts as the second semiconductor layer 116. The p-type semiconductor layer includes a material selected from the group consisting of (poly(3-alkylthiophene)), (poly(9,9-dioctylfluorene-co-bithiophene)), tetracene, pentacene, hexacene, and anthracene, and the n-type substrate and the n-type semiconductor layer include a material selected from the group consisting of naphthalene carbodiimide, perylene tetracarboxylic diimide, and fluorocarbon-substituted thiophene.

In the present embodiment, the FET structure 10 is implemented in form of a JL FET, and the dopant concentration of the channel region 106b is substantially the same as the dopant concentration of the source/drain regions 106a. The dopant concentration gradient between the source/drain regions 106a and the channel region 106b is substantially zero, and the issue of diffusion does not occur. Hence, the requirement of the conventional P-N junction for costly ultra-fast annealing technique is no longer needed, and the device with the reduced channel length can be manufactured.

In the first embodiment, the FET structure 10 may further include contact metal (not shown) located on the source/drain regions 106a, and the contact metal is selected from the group consisting of metal nitride, metal silicide, tantalum nitride, and titanium nitride, for instance.

In the present embodiment, the FET structure 10 is implemented in form of a hybrid P-N channel constituted by the first and second semiconductor layers 114 and 116 that have different conductive types. Through the hybrid P-N channel, the SCE can be greatly controlled. Besides, the threshold voltage can also be controlled with ease by controlling the dopant concentration of the n-type substrate, and thus the circuit design of multi-threshold voltage can be accomplished.

According to the first embodiment, the gate dielectric insulator 108 is implemented in form of a dielectric layer, for instance, and the gate dielectric insulator 108 may include a dielectric layer 108a located on the channel region 106b and a polar ferroelectric layer 108b located on the dielectric layer 108a. The polar ferroelectric layer 108b can achieve a negative capacitance effect. Therefore, the FET structure 10 may be a negative capacitance effect transistor and may have a small sub-threshold swing. Here, the sub-threshold swing (SS) is defined as an inverse ratio of the change in electric current to the change in the gate voltage per unit. In an embodiment of the disclosure, the dielectric layer 108a is silicon oxide or zirconium silicate, for instance. The polar ferroelectric layer 108b is a material selected from the group consisting of hafnium zirconium oxide ($HfZrO_x$), barium titanate, lead titanate, potassium niobate, potassium tantalite, lithium niobate, and lithium tantalite, for instance. The gate conductor 110 is a conductive metal layer or a conductive polysilicon layer, for instance.

In another embodiment, if the FET structure 10 acts as a non-volatile memory, the reference number 108a may represent the polar ferroelectric layer in the gate dielectric insulator 108, and the reference number 108b may represent a charge trapping layer in the gate dielectric insulator 108. Note that locations of the polar ferroelectric layer 108a and the charge trapping layer 108b are exchangeable.

In some embodiments of the disclosure, the charge trapping layer 108b is composed by a layer of metal, semiconductor, or dielectric, for instance. The FET structure 10 is a nano-dot memory, for instance.

In other embodiments, the charge trapping layer 108b is $Zr_xHf_ySr_zSiO_3$, metal, a semiconductor, nano-dot metal, or an insulator, and the polar ferroelectric layer 108a is $Li_xHf_yZr_zO_3$, $Pb_xBa_ySr_zTiO_3$, $Li_xK_yTa_zNbO_3$, $La_xSr_yBa_zMnO_3$, $Zr_xHf_ySr_zSiO_3$, $Ba_xLa_ySr_zFe_rO_3$, $Ba_xLa_ySr_zNiO_3$, or $Ba_xLa_ySr_zCoO_3$. Here, $0 \leq x \leq 1$, $0 \leq y \leq 1$, $0 \leq z \leq 1$, and $0 \leq r \leq 1$.

FIG. 3A to FIG. 3E are schematic views illustrating a manufacturing process of an FET structure according to a second embodiment of the disclosure.

Figure 3A:
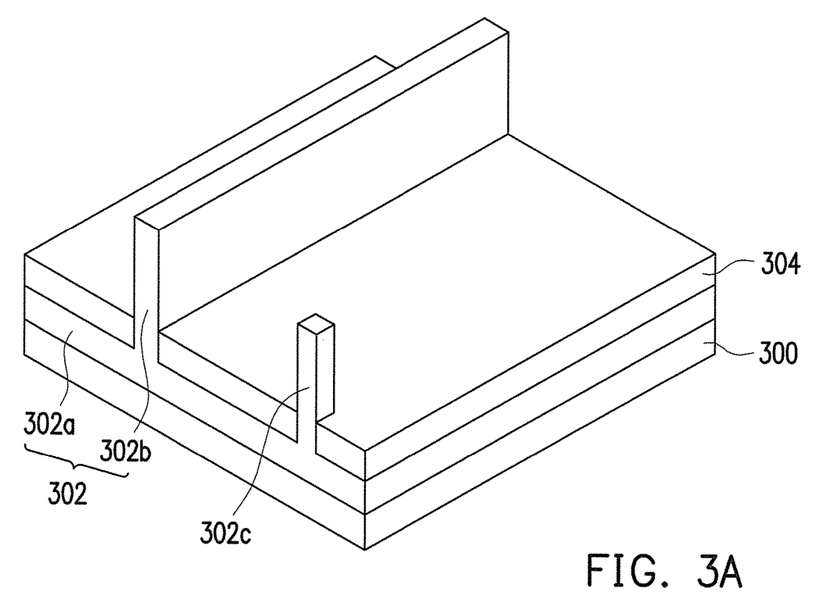

With reference to FIG. 3A, an internal gate 302 is formed on a substrate 300 through performing an epitaxial growing process and a photolithography and etching process. The internal gate 302 includes a floor portion 302a, a wall portion 302b, and a contact pillar 302c. The contact pillar 302c and the internal gate 302 belong to the same structure. A deposition process and a dry etching process are performed, so as to form an insulation layer 304 on the floor portion 302a of the internal gate 302, and the wall portion 302b and the contact pillar 302c are exposed.

Figure 3B:
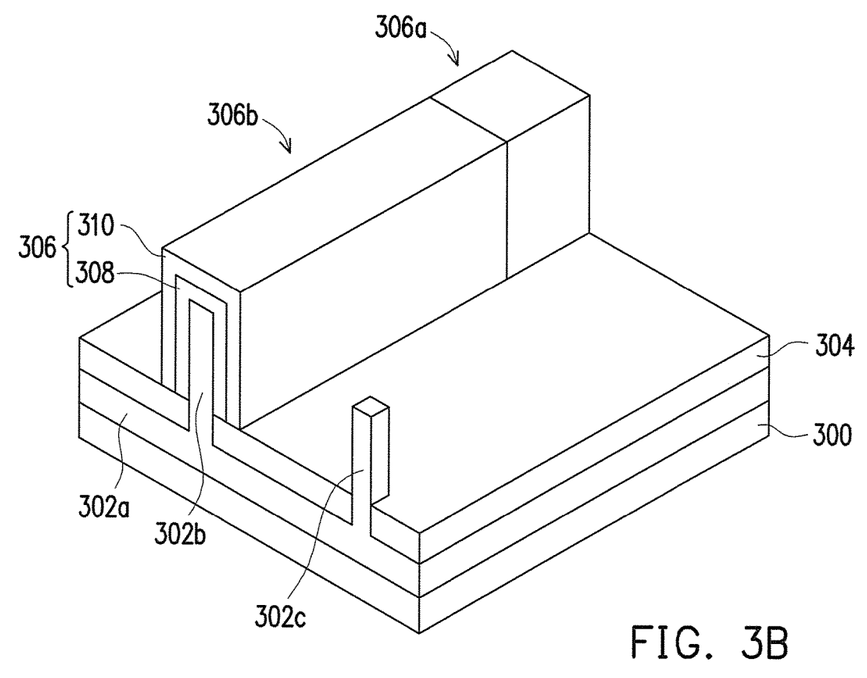

With reference to FIG. 3B, an epitaxial growing process is performed to sequentially form a first semiconductor layer 308 and a second semiconductor layer 310 of a semiconductor strip 306. The semiconductor strip 306 includes source/drain regions 306a and a channel region 306b adjacent to the source/drain regions 306a.

Figure 3C:
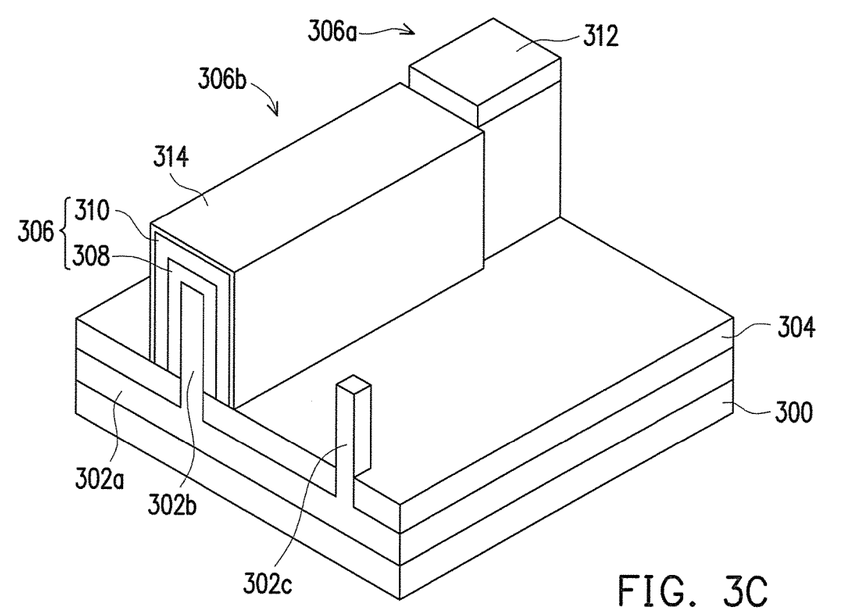

With reference to FIG. 3C, a deposition process and a photolithography and etching process are performed to form a hard mask layer 312 on a top surface of the source/drain regions 306a of the semiconductor strip 306. A material of the hard mask layer 312 is $SiN_x$, $SiO_x$, or SiC, for instance. Besides, a photoresist material layer 314 covers a surface of the channel region 306b of the semiconductor strip 306. Therefore, except for the sidewalls of the source/drain regions 306a of the semiconductor strip 306, the semiconductor strip 306 is covered.

Figure 3D:
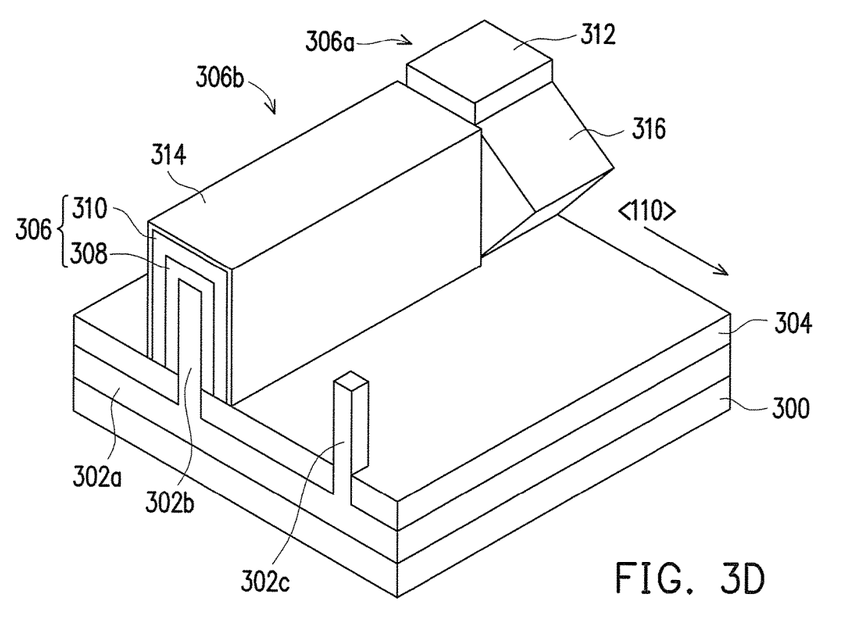

With reference to FIG. 3D, single crystal silicon is formed on the sidewalls of the source/drain regions 306a, and the lattice direction of the single crystal silicon is <110>, as shown by the arrow. Specifically, the single crystal silicon is selectively grown on the exposed sidewalls of the semiconductor strip 306 along the lattice direction <110> through performing the epitaxial growth, and a protrusion 316 made of the single crystal silicon is formed on the sidewalls of the source/drain regions 306a. Accordingly, the width of the source/drain regions 306a of the semiconductor strip 306 is increased, and the series resistance is reduced. In an embodiment of the disclosure, the second semiconductor layer 310 in the channel region 306b is the inverted-U shaped structure, and the second semiconductor layer 310 in the source/drain regions 306a has a hexagonal cross-section.

Figure 3E:
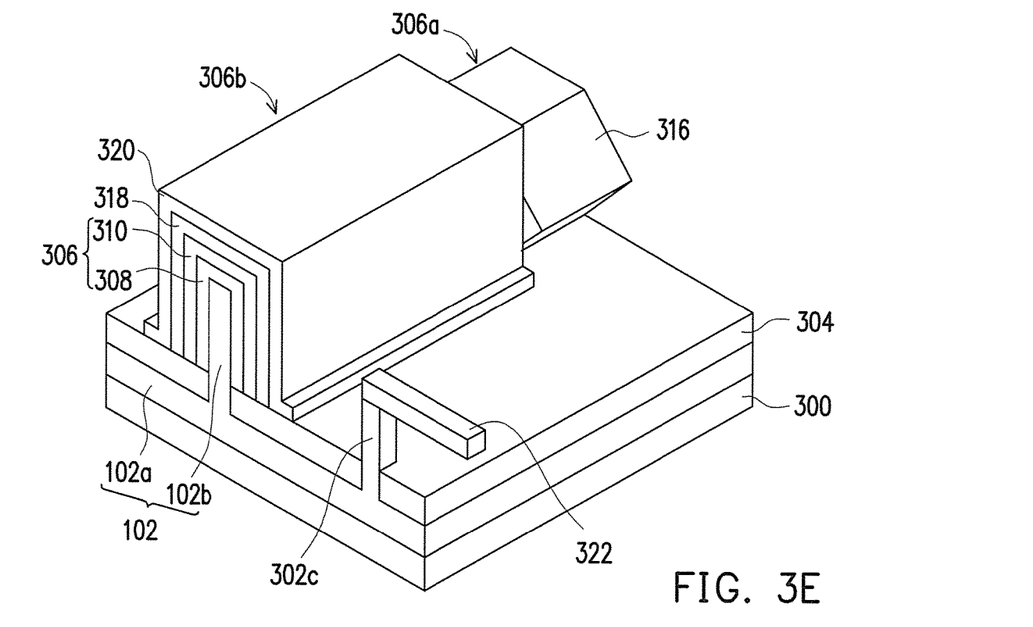

With reference to FIG. 3E, the hard mask layer 312 and the photoresist material layer 314 are respectively removed, and a gate dielectric insulator 318 is formed on the channel region 306b of the semiconductor strip 306. A deposition process and a photolithography and etching process are preformed to form a gate conductor 320 and an electrical contact 322 connected to the contact pillar 302c on the gate dielectric insulator 318.

Figure 4:
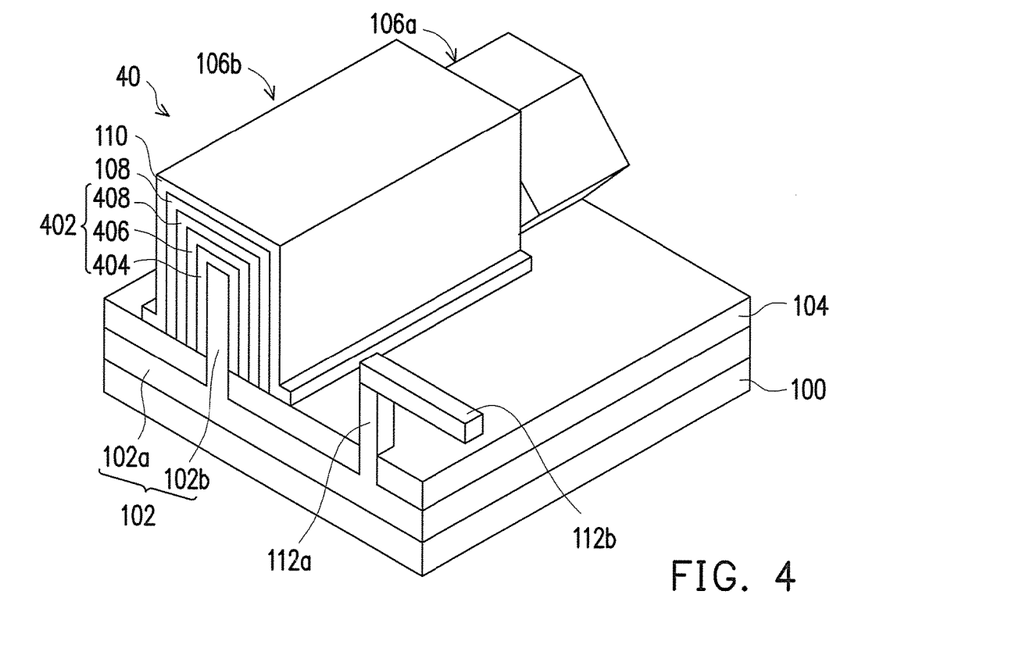
FIG. 4 is a schematic three-dimensional view illustrating an FET structure according to a third embodiment of the disclosure.

FIG. 4 is a schematic three-dimensional view illustrating an FET structure according to a third embodiment of the disclosure. It should be mentioned that the same reference numbers or symbols as those in the first embodiment are also used herein to represent the same components.

With reference to FIG. 4, the difference between the FET structure 40 and the FET structure 10 provided in the first embodiment is that the semiconductor strip 402 of the FET structure 40 includes a first semiconductor layer 404, a second semiconductor layer 406, and a third semiconductor layer 408. In an embodiment of the disclosure, the first semiconductor layer 404 has a first conductive type, the second semiconductor layer 406 has a second conductive type, the third semiconductor layer 408 is different from the second semiconductor layer 406 and has the first conductive type, and the third semiconductor layer 408 is located on the second semiconductor layer 406. For instance, the first semiconductor layer 404 is a p-type semiconductor layer, the second semiconductor layer 406 is an n-type semiconductor layer, and the third semiconductor layer 408 is a p-type semiconductor layer. By contrast, the first semiconductor layer 404 may also be an n-type semiconductor layer, the second semiconductor layer 406 may be a p-type semiconductor layer, and the third semiconductor layer 408 may be an n-type semiconductor layer.

Figure 5:
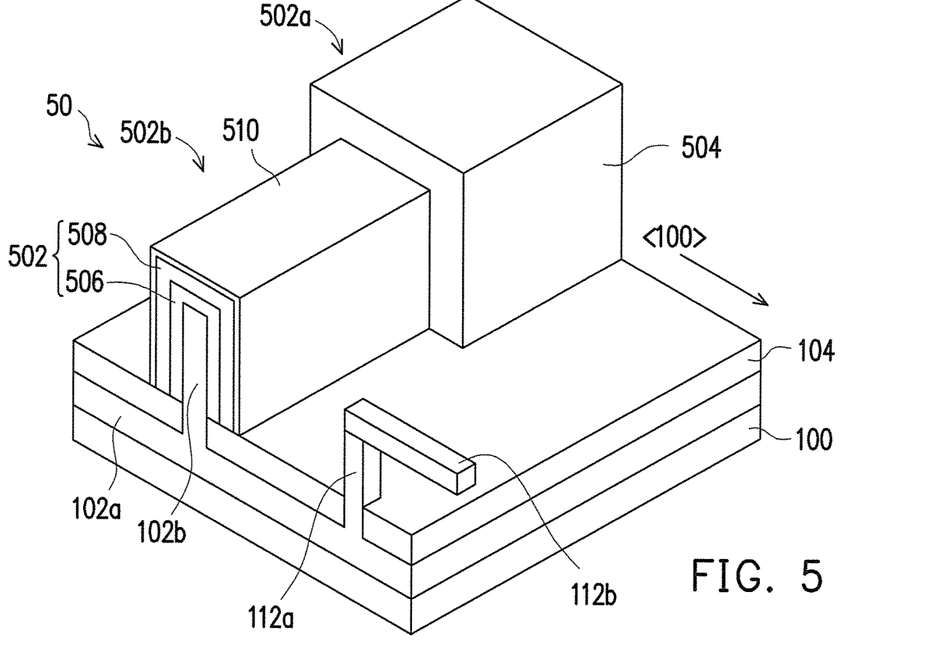
FIG. 5 is a schematic three-dimensional view illustrating an FET structure according to a fourth embodiment of the disclosure.

FIG. 5 is a schematic three-dimensional view illustrating an FET structure according to a fourth embodiment of the disclosure. It should be mentioned that the same reference numbers or symbols as those in the first embodiment are also used herein to represent the same components.

With reference to FIG. 5, the difference between the FET structure 50 and the FET structure 10 provided in the first embodiment is that the semiconductor strip 502 is formed by single crystal silicon, and the lattice direction of the single crystal silicon on the sidewalls of the semiconductor strip 502 is <100>, as shown by the arrow. Specifically, after the semiconductor strip 502 constituted by the first semiconductor layer 506 and the second semiconductor layer 508 is formed, the channel region 502b is covered by the photoresist material layer 510, and an epitaxial growing process is performed, such that the single crystal silicon 504 is grown on the top surface and two sidewalls of the source/drain regions 502a in the semiconductor strip 502. Accordingly, the height and the width of the source/drain regions 502a of the semiconductor strip 306 are increased, and the series resistance is reduced. In FIG. 5, the cross-section of the channel region 502b in the semiconductor strip 502 is substantially rectangular, and the cross-section of the source/drain regions 502a has an open-ended rectangular shape. A gate dielectric insulator (not shown) and a gate conductor (not shown) are then formed by performing steps shown in FIG. 3E, which will not be further explained herein.

Figure 6:
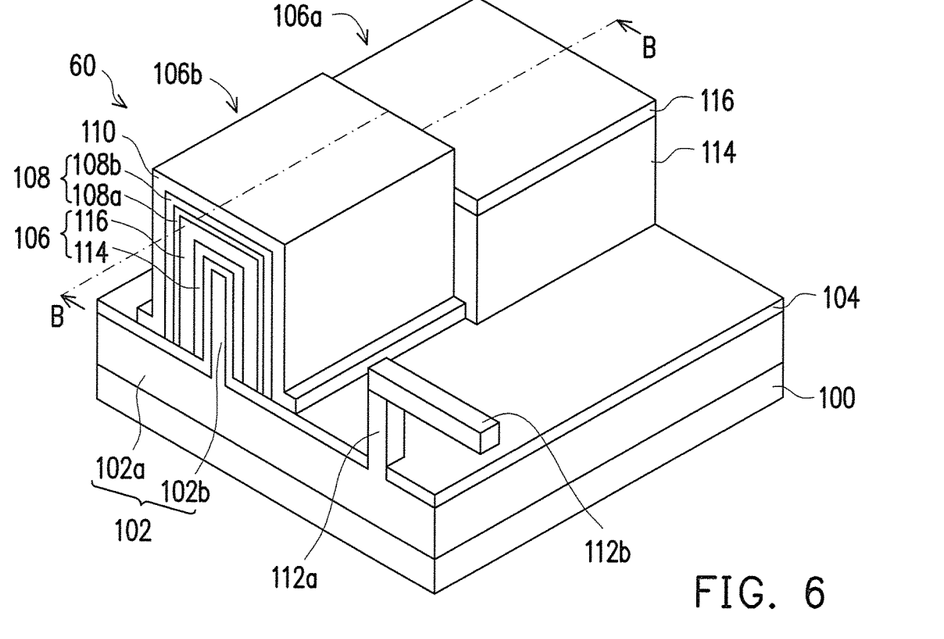
FIG. 6 is a schematic three-dimensional view illustrating an FET structure according to a fifth embodiment of the disclosure.
Figure 7:
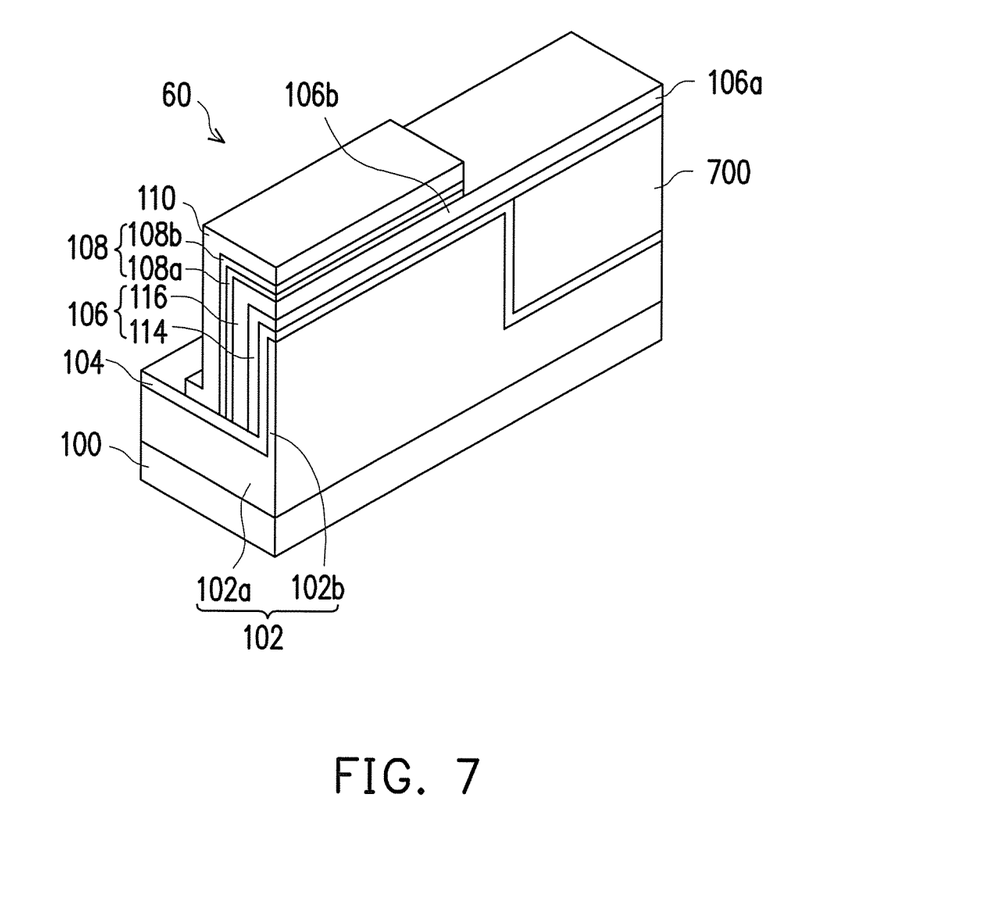
FIG. 7 is a schematic three-dimensional view taken along a section line B-B depicted in FIG. 6.

FIG. 6 is a schematic three-dimensional view illustrating an FET structure according to a fifth embodiment of the disclosure. FIG. 7 is a schematic three-dimensional view taken along a section line B-B depicted in FIG. 6. It should be mentioned that the same reference numbers or symbols as those in the first embodiment are also used herein to represent the same components.

With reference to FIG. 6 and FIG. 7, the difference between the FET structure 60 and the FET structure 10 provided in the first embodiment is that the internal gate 102 and the semiconductor strip 106 of the FET structure 10 are preferably single crystal silicon through epitaxial growth, and the internal gate 102 and the semiconductor strip 106 of the FET structure 60 are conductive polysilicon. Moreover, in the FET structure 60, the internal gate 102 extends from the channel region 106b to a portion of source/drain regions 106a. Besides, the insulation layer 104 not only covers the floor portion 102a of the internal gate 102 but also extends to the top surface and two sidewalls of the wall portion 102b where the channel region 102b is to be formed. A conductive bump 700 is formed on the source/drain regions 106a.

FIG. 8A to FIG. 8E are schematic views illustrating a manufacturing process of an FET structure according to a sixth embodiment of the disclosure.

Figure 8A:
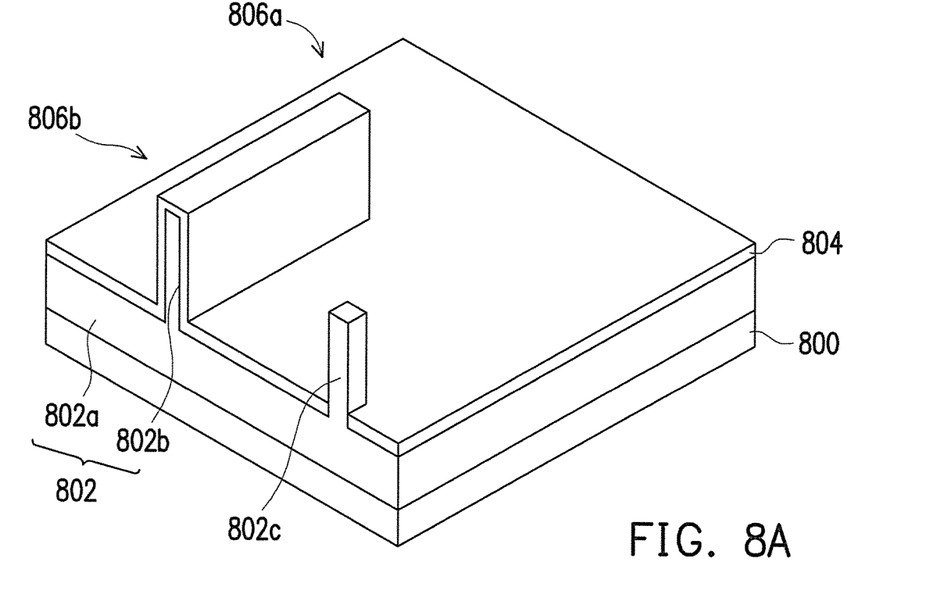

With reference to FIG. 8A, an internal gate 802 is formed on a substrate 800 through performing an epitaxial growing process and a photolithography and etching process. The internal gate 802 includes a floor portion 802a, a wall portion 802b, and a contact pillar 802c. The contact pillar 802c and the internal gate 802 belong to the same structure. A deposition process and a dry etching process are performed, so as to form an insulation layer 804 on the floor portion 802a and the wall portion 802b of the internal gate 802, and the contact pillar 802c is exposed.

In the present embodiment, the wall portion 802b of the internal gate 802 is substantially formed on a location where the channel region 806b is to be formed, and the wall portion 802b does not extend to the location where the source/drain regions 806a are to be formed. Hence, it is expected that the back-gate bias voltage has limited effect to the channel region 806b and substantially no impact on the source/drain regions 806a. The internal gate 802 is made of conductive polysilicon which is formed by depositing a non-doped amorphous silicon layer through low pressure chemical vapor deposition (LPCVD) and solid-phase crystallizing the amorphous silicon layer to form a solid phase crystallization (SPC) layer. Here, if phosphorous ions are applied to perform an ion implantation process on the SPC layer, an n-type semiconductor layer is formed; if boron difluoride ions are applied to perform the ion implantation process on the SPC layer, a p-type semiconductor layer is formed.

An insulation layer 804 is formed by performing a deposition process and a dry etching process. The insulation layer 804 covers the top surface and two sidewalls of the wall portion 802b where the channel region 806b is to be formed, so as to electrically insulate the wall portion 802b of the internal gate 802 from the semiconductor strip 806 in the subsequently formed channel region 806b.

Figure 8B:
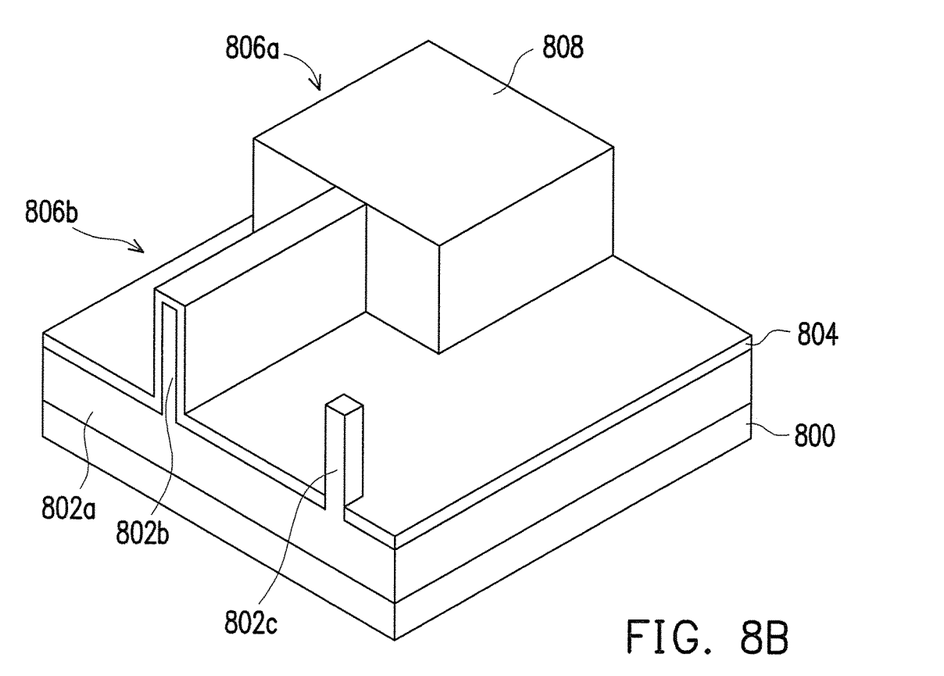

With reference to FIG. 8B, a deposition process and a photolithography and etching process are performed to form a conductive bump 808 in the source/drain regions 806a. The conductive bump 808 is, for instance, conductive polysilicon. The manufacturing method of the conductive bump 808 is similar to the internal gate 802 depicted in FIG. 8A.

Figure 8C:
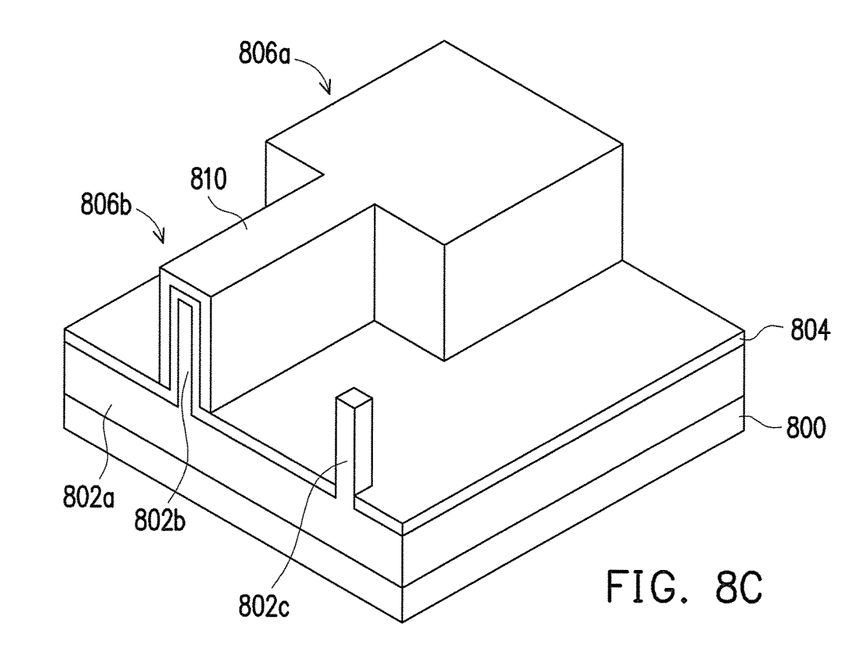

With reference to FIG. 8C, a deposition process and a photolithography and etching process are performed to form a first semiconductor layer 810 on the insulation layer 804 and the conductive bump 808. The first semiconductor layer 810 is, for instance, conductive polysilicon. The manufacturing method of the first semiconductor layer 810 is similar to that of the internal gate 802 depicted in FIG. 8A.

Figure 8D:
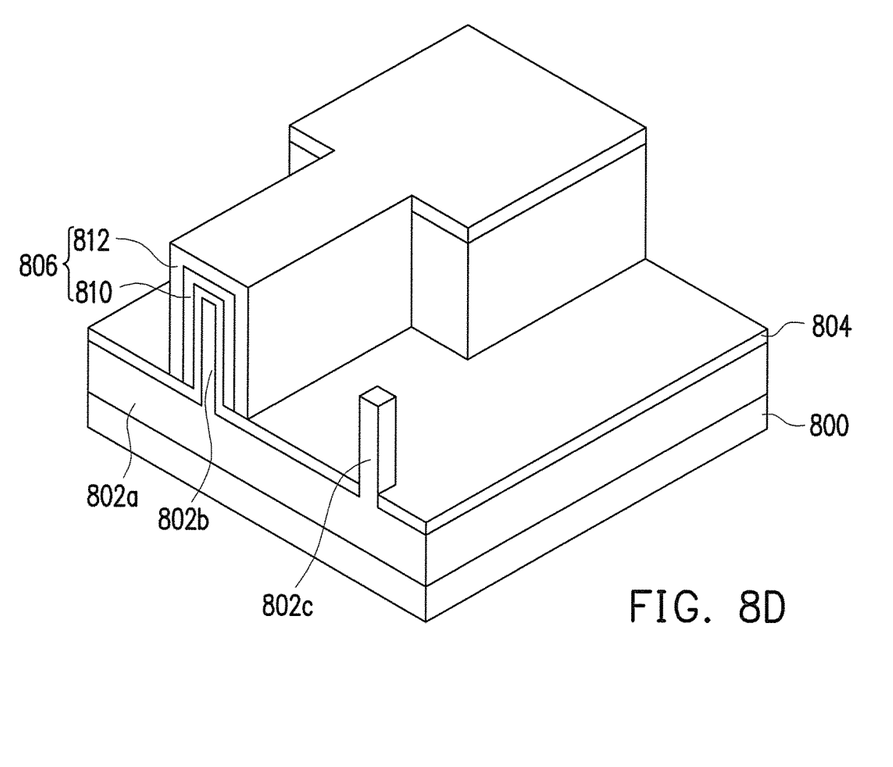

With reference to FIG. 8D, a second semiconductor layer 812 is formed on the first semiconductor layer 810 through performing a deposition process and a photolithography and etching process, so as to obtain the semiconductor strip 806 constituted by the first semiconductor layer 810 and the second semiconductor layer 812. The second semiconductor layer 812 is, for instance, conductive polysilicon. The manufacturing method of the second semiconductor layer 812 is similar to that of the internal gate 802 depicted in FIG. 8A.

Figure 8E:
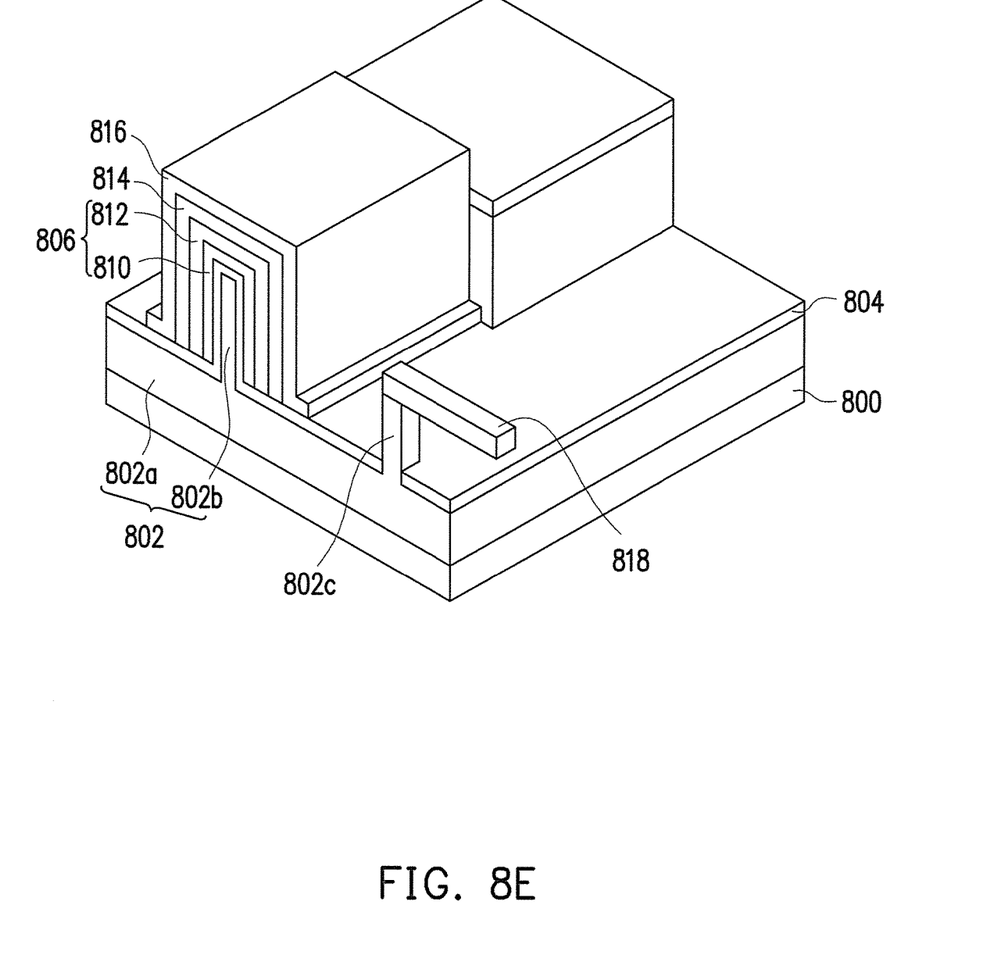

With reference to FIG. 8E, a gate dielectric insulator 814 that covers the semiconductor strip 806 is formed on the wall portion 802b of the internal gate, and a gate conductor 816 and an electrical contact 818 connected to the contact pillar 802c are formed on the gate dielectric insulator 814 through performing a deposition process and a photolithography and etching process.

To sum up, as provided in the embodiments of the disclosure, the hybrid P-N channel is used in the JL transistor, which is conducive to the simplification of the manufacturing process and better preventing the issue of the roll-off of the threshold voltage; what is more, the resultant FET structure can be characterized by a negligible BIDL, the SS approximating to an ideal value, a high on/off current ratio, high threshold voltage modulation, reduced LFN, good reliability, low current leakage, small series resistance, and reduced current crowding effects. With the design of a three-dimensional dual-gate structure, in view of the electrical performance, the threshold voltage can be better controlled, and the issue of the short channel effect can be resolved, and the current driving capability can be enhanced. In addition, the physical and manufacturing limitation on the miniaturization of the gate length can be broken. As a result, the FET structure provided herein complies with the future trend of miniaturization and can be applied to low-standby-power devices, IoT-related devices, and three-dimensional integrated circuits (3D IC).

Although the disclosure has been provided with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A field effect transistor structure comprising:
   a substrate;
   an internal gate comprising a floor portion located on the substrate and a wall portion extending from the floor portion;
   an insulation layer located on the floor portion of the internal gate;
   a semiconductor strip located on the wall portion and a portion of the insulation layer, the semiconductor strip comprising source/drain regions and a channel region adjacent to the source/drain regions;
   a gate dielectric insulator located on the channel region;
   a gate conductor located on the gate dielectric insulator; and
   a contact pillar connected to the floor portion of the internal gate.

2. The field effect transistor structure of claim 1, wherein the wall portion comprises a semiconductor, a conductor, or an insulator.

3. The field effect transistor structure of claim 1, wherein the semiconductor strip comprises a first semiconductor layer and a second semiconductor layer located on the first semiconductor layer, and a conductivity type of the first semiconductor layer is different from a conductivity type of the second semiconductor layer.

4. The field effect transistor structure of claim 3, wherein the insulation layer is replaced by a third semiconductor layer with a conductivity type different with the conductivity type of the first semiconductor layer for forming a pn junction.

5. The field effect transistor structure of claim 3, wherein the first semiconductor layer in the channel region is an inverted-U shaped structure, and the wall portion extends into the inverted-U shaped structure from the floor portion.

6. The field effect transistor structure of claim 3, wherein the semiconductor strip further comprises a third semiconductor layer different from the second semiconductor layer, and the third semiconductor layer is located on the second semiconductor layer.

7. The field effect transistor structure of claim 1, wherein the substrate comprises a semiconductor or a conductor.

8. The field effect transistor structure of claim 1, wherein the substrate comprises metal.

9. The field effect transistor structure of claim 1, wherein the internal gate comprises a conductive poly-semiconductor, an amorphous semiconductor, or a single crystal material.

10. The field effect transistor structure of claim 1, wherein the internal gate comprises a conductive material.

11. The field effect transistor structure of claim 10, wherein the charge trapping layer comprises $Zr_xHf_ySr_zSiO_3$, metal, a semiconductor, nano-dot metal, or an insulator, the polar ferroelectric layer comprises $Li_xHf_yZr_zO_3$, $Pb_xBa_ySr_zTiO_3$, $Li_xK_yTa_zNbO_3$, $La_xSr_yBa_zMnO_3$, $Zr_xHf_ySr_zSiO_3$, $Ba_xLa_ySr_zFe_rO_3$, $Ba_xLa_ySr_zNiO_3$, or $Ba_xLa_ySr_zCoO_3$, $0 \leq x \leq 1$, $0 \leq y \leq 1$, $0 \leq z \leq 1$, and $0 \leq r \leq 1$.

12. The field effect transistor structure of claim 1, wherein the gate dielectric insulator comprises a dielectric layer located on the channel region and a polar ferroelectric layer located on the dielectric layer, and the polar ferroelectric layer achieves a negative capacitance effect.

13. The field effect transistor structure of claim 1, wherein the gate dielectric insulator comprises a polar ferroelectric layer and a charge trapping layer, locations of the polar ferroelectric layer and the charge trapping layer are exchangeable, and the field effect transistor structure acts as a non-volatile memory.

14. The field effect transistor structure of claim 1, wherein the gate dielectric insulator comprises a charge trapping layer and a polar ferroelectric layer successively formed on the charge trapping layer, and the field effect transistor structure acts as a non-volatile memory.

15. The field effect transistor structure of claim 14, wherein the charge trapping layer is composed by a layer of metal, semiconductor, or dielectric.

16. The field effect transistor structure of claim 15, wherein the field effect transistor structure is a nano-dot memory.

17. The field effect transistor structure of claim 1, wherein the substrate is a p-type substrate, the internal gate is an n-type conductor, the semiconductor strip comprises a p-type semiconductor layer located above the internal gate and an n-type semiconductor layer located on the p-type semiconductor layer, the p-type substrate and the p-type semiconductor layer comprise a material selected from the group consisting of (poly(3-alkylthiophene)), (poly(9,9-dioctylfluorene-co-bithiophene)), tetracene, pentacene, hexacene, and anthracene, and the n-type semiconductor layer comprises a material selected from the group consisting of naphthalene carbodiimide, perylene tetracarboxylic diimide, and fluorocarbon-substituted thiophene.

18. The field effect transistor structure of claim 1, wherein the substrate is an n-type substrate, the internal gate is a p-type conductor, the semiconductor strip comprises an n-type semiconductor layer located above the internal gate and a p-type semiconductor layer located on the n-type semiconductor layer, the p-type semiconductor layer comprises a material selected from the group consisting of (poly(3-alkylthiophene)), (poly(9,9-dioctylfluorene-co-bithiophene)), tetracene, pentacene, hexacene, and anthracene, and the n-type substrate and the n-type semiconductor layer comprise a material selected from the group consisting of naphthalene carbodiimide, perylene tetracarboxylic diimide, and fluorocarbon-substituted thiophene.

* * * * *